United States Patent
Kim et al.

(10) Patent No.: US 7,697,314 B2
(45) Date of Patent: Apr. 13, 2010

(54) DATA LINE LAYOUT AND LINE DRIVING METHOD IN SEMICONDUCTOR MEMORY DEVICE

(75) Inventors: Nam-Seog Kim, Suwon-si (KR);
Hak-Soo Yu, Seongnam-si (KR);
Uk-Rae Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 62 days.

(21) Appl. No.: 12/006,502

(22) Filed: Jan. 3, 2008

(65) Prior Publication Data

US 2008/0165559 A1 Jul. 10, 2008

(30) Foreign Application Priority Data

Jan. 4, 2007 (KR) .................... 10-2007-0000890

(51) Int. Cl.
*G11C 5/06* (2006.01)
(52) U.S. Cl. .............. 365/63; 365/189.17; 365/189.03; 365/189.08; 365/230.06
(58) Field of Classification Search .............. 354/63, 354/189.17, 189.03, 189.08, 230.06
See application file for complete search history.

(56) References Cited

U.S. PATENT DOCUMENTS

| | | | |
|---|---|---|---|
| 4,698,788 A * | 10/1987 | Flannagan et al. | ........... 365/205 |
| 5,309,393 A * | 5/1994 | Sakata et al. | ........... 365/189.17 |
| 5,386,394 A | 1/1995 | Kawahara et al. | |
| 5,586,076 A * | 12/1996 | Miyamoto et al. | ........... 365/203 |
| 5,886,943 A * | 3/1999 | Sekiguchi et al. | ....... 365/230.03 |
| 5,917,745 A | 6/1999 | Fujii | |
| 5,966,340 A | 10/1999 | Fujino et al. | |
| 6,081,479 A | 6/2000 | Ji et al. | |
| 6,118,715 A | 9/2000 | Arimoto | |
| 6,157,560 A * | 12/2000 | Zheng | ........................ 365/63 |
| 6,172,918 B1 * | 1/2001 | Hidaka | .................. 365/189.11 |
| 6,678,195 B2 * | 1/2004 | Hidaka | ........................ 365/200 |
| 7,161,867 B2 * | 1/2007 | Kaku | .................... 365/230.03 |
| 2005/0243621 A1 | 11/2005 | Kuroda | |

* cited by examiner

*Primary Examiner*—Viet Q Nguyen
(74) *Attorney, Agent, or Firm*—Mills & Onello, LLP

(57) ABSTRACT

A data line layout structure comprises a plurality of first data lines, second data lines, a third data line, a first data line driver, and a second data line driver. The plurality of first data lines are connected to sub mats in a memory mat so that a predetermined number of first data lines are connected to each sub mat. The second data lines are disposed in a smaller quantity than the number of the first data lines so as to form a hierarchy with respect to the first data lines. The third data line is disposed to form a hierarchy with respect to the second data lines, and transfers data provided through the second data lines to a data latch. The first data line driver is connected between the first data lines and the second data lines, and performs a logical ORing operation for output of the first data lines so as to drive a corresponding second data line. The second data line driver is connected between the second data lines and the third data line, and performs a logical ORing operation for output of the second data lines so as to drive the third data line.

11 Claims, 8 Drawing Sheets

DATA LINE LAYOUT AND LINE DRIVING METHOD IN SEMICONDUCTOR MEMORY DEVICE

This U.S. nonprovisional patent application claims priority under 35 U.S.C. §119 of Korean Patent Applications 10-2007-0000890 filed in the Korean Intellectual Property Office on Jan. 4, 2007, the entire contents of which are hereby incorporated by reference.

FIELD OF THE INVENTION

The present invention relates to semiconductor memory devices, and more particularly, to an advanced data line layout and line driving method in a semiconductor memory device such as a static random access memory etc.

DESCRIPTION OF THE RELATED ART

In general, various semiconductor devices with integrated circuit chips such as CPUs, memories, and gate arrays etc., are combined within various electronic products such as personal computers, portable multimedia players, workstations, etc. Increasingly high speed in operation of electronic products brings about an increasingly reduced swing width of signals interfaced between the semiconductor devices. This substantially reduces delay time in transfer of signals. Under such circumstances and in a data access mode of reading data stored in a memory cell of semiconductor memory device, the layout of data lines to transfer output data outside a chip and a logical ORing operation speed for the lines directly affect line loading, consumption of current, a data skew problem and complication in the layout of lines.

Typically, a semiconductor memory device such as a static random access memory (SRAM) etc. has a layout structure of memory mats as shown in FIG. 1. Referring to FIG. 1 illustrating a memory mat layout of a general static RAM, excepting special use SRAMs, a plurality of memory mats 20 constituting a memory cell array are disposed. In FIG. 1, six memory mats constitutes one bank. Each memory mat 20 is divided into half memory mats 20a and 20b, sharing a center region 10 between mats, and a plurality of pads 40 are disposed along an edge of the chip. In configuring an SRAM memory cell array constructed of six mats as shown in FIG. 1, six input/output (I/O) terminals are allocated to each mat in the x36 data output organization.

In a general memory, data is transferred between a memory cell and an I/O terminal by using two kinds of wire connections such as a bit line and a data line, etc. A data line has a relatively large wiring load as compared with a bit line, and is generally provided on a memory array, and is used to transfer data between the bit line and the I/O terminal.

In FIG. 1, a reference character P1 indicates a decoding path, and P2 indicates a data path. A corresponding memory cell must be accessed by a combination of all addresses, thus all address lines are gathered on a center of the memory mat. Thus, the decoding path P1 is disposed being directed from a center of the memory mat 20 toward the outside of chip as shown in the drawing. This indicates a memory cell on an external neighborhood of the chip is accessed latest in view of decoding. In the direction of the data path P2, data read from a memory cell of the center is transferred through a longest path as pads are disposed on the edge of the chip, as an opposed case from the decoding path. That is, according to a combined layout of the decoding path and the data path, in a memory cell positioned on an outer side of the chip, an accessing time is slow but a data path is short, and in a memory cell positioned in the inside of the chip, an accessing time is fast but a data path is long, thereby providing the structure of reducing skew.

FIG. 2 illustrates a data path of sub mats constituting the memory mat of FIG. 1. Reference number 20a indicates that a half memory mat shown in FIG. 2 corresponds with the reference number 20a of FIG. 1. The mat 20a shown in FIG. 2 corresponds to a half of the memory mat 20 of FIG. 1.

In FIG. 2, the half memory mat 20a is subdivided into a plurality of sub mats 21a, 21b, ..., 21n. The size of a sub mat depends upon the number of cells connected to one bit line. When the number of all sub mats is small, that is, one sub mat is large; the number of memory cells connected to one bit line is relatively many. Thus, when a memory capacity of a sub mat is large, a development time of bit line selected in reading data from an optional memory cell is relatively long, causing a slow speed in a memory chip. That is, the number of memory cells connected to each bit line is limited to achieve SRAM operation at high speed and thus the number of sub mats increases.

In FIG. 2, a plurality of sub mats 21a, 21b, ..., 21n are each connected to an ORing unit 50 through each of six main data lines MDL. The ORing unit 50 performs a logical ORing operation for data of main data lines, and outputs the result of the logical operation to a data latch 60. Data latched to the data latch 60 is transmitted to an output pad through a data multiplexer 70.

In the structure having many sub mats on a memory mat to achieve high speed operation as shown in FIG. 2, the following difficulty is caused in merging data lines from respective sub mats. First, it must be determined whether data to be output through a logical OR operation on data lines of each sub mat is '0' or '1'. In this case, all data lines (MDL in FIG. 2) of each sub mat must be passed through a center portion of the memory mat, thus an occupied area with a layout of a lot of data lines increases, increasing line loading of the data output path.

Second, in performing an OR logical operation for several data lines by one OR gate 50a having many inputs as shown in FIG. 3, delay time increases substantially, causing skew between data and lowering a performance of memory chip.

FIG. 3 illustrates an example of a logic gate constituting the ORing unit 50 of FIG. 2. An embodiment of an OR logic, may be realized as a NAND gate. Most data lines are first precharged to a high level, and when data '1' is read, the data lines maintain intact the precharge state, and when data '0' is read, the data lines are discharged to a ground level. Thus, the NAND gate 50a as in FIG. 3 is appropriate to realize the ORing unit.

In the conventional art described above, the number of data lines disposed on a center portion of a memory mat is large and so an occupied area increases, causing an increase in loading of lines, and furthermore, a logical ORing operation for data lines is performed at a time by a logic gate having many inputs, causing a limit in a high speed read operation.

SUMMARY OF THE INVENTION

Accordingly, some embodiments of the invention provide an effective layout structure of data lines in a semiconductor memory device.

Some embodiments of the invention provide a data line layout structure which substantially reduces line loading of a data output path in a semiconductor memory device such as a static RAM etc.

Some embodiments of the invention provide a line driving method which performs a logical ORing operation for data lines at a relatively higher speed in a semiconductor memory device such as a static RAM etc.

Some embodiments of the invention provide a data line layout structure and a data line ORing method, which reduce the number of data lines in a memory mat and substantially reduce data skew.

According to one aspect, the present invention is directed to a data line layout structure in a semiconductor memory device, comprising: lower data lines coupled to a back stage of a sense amplifier; upper data lines being fewer in number than the lower data lines and being disposed to form a hierarchy with respect to the lower data lines, the upper data lines being coupled to a front stage of a data latch; and a data line driver of a dynamic complementary metal-oxide semiconductor (CMOS) logic type connected between the lower data lines and the upper data lines, the data line driver performing a logical ORing operation on output of the lower data lines so as to drive the upper data lines.

In one embodiment, the data line driver has at least four inputs.

According to another aspect, the present invention is directed to a data line layout structure in a semiconductor memory device, comprising: a plurality of first data lines connected to sub mats in a memory mat, a predetermined number of first data lines being connected to each sub mat; second data lines being fewer in number than the first data lines and being disposed so as to form a hierarchy with respect to the first data lines; a third data line disposed to be higher in the hierarchy with respect to the second data lines, the third data line transferring data provided through the second data lines to a data latch; a first data line driver connected between the first data lines and the second data lines, the first data line driver performing a logical ORing operation on output of the first data lines so as to drive a corresponding second data line; and a second data line driver connected between the second data lines and the third data line, the second data line driver performing a logical ORing operation on output of the second data lines so as to drive the third data line.

In one embodiment, the first and second data line drivers each receive at least four lower inputs. In one embodiment, the first and second data line drivers each have a driving operation of dynamic CMOS logic type.

In one embodiment, the first and second data line drivers each include an 8-input NAND gate.

In one embodiment, the first and second data line drivers each include a 4-input NAND gate.

In one embodiment, when the number of sub mats in the memory mat is 16, the number of memory mats is 6. In one embodiment, the memory mats constitute a memory cell array of a static random access memory (RAM). In one embodiment, a decoding and a data path of the static RAM have a structure to reduce a signal skew.

In one embodiment, the first data line driver comprises: a plurality of short pulse generators connected to the first data line, for generating a short pulse having a determined width when a logic of read data has a first state; a plurality of NMOS transistors whose respective gate terminals are coupled to each output terminal of the short pulse generators, whose respective drain terminals are coupled in common to the second data line, and whose respective source terminals are coupled to a ground voltage; and a precharge unit for precharging the second data line to a determined power source voltage. In one embodiment, the second data line driver comprises: a plurality of NMOS transistors whose gate terminals are individually connected to each output of the first data line driver, whose drain terminals are individually connected in common to the third data line, and whose source terminals are individually connected to a ground voltage; and a precharge unit for precharging the third data line to a determined power source voltage. In one embodiment, the precharge unit comprises a PMOS transistor, a delay device and an inverter which are connected to the third data line.

According to another aspect, the present invention is directed to a method of driving a line in a semiconductor memory device, the method comprising: disposing data lines in a hierarchical structure of a local main data line, a sub global main data line and a global main data line so as to form a hierarchical structure of the data lines to form a data path between input/output sense amplifiers and a data latch; performing a first logical ORing operation of discharging a corresponding sub global main data line of the hierarchical structure from a precharge level to a ground level when one of the local main data lines has a first state level; and performing a second logical ORing operation of discharging a corresponding global main data line of the hierarchical structure from a precharge level to a ground level when one of the sub global main data lines has a first state level.

In one embodiment, the performing of the first and second logical ORing operations is obtained by implementing a driving operation based on each of one or more edge-triggered dynamic CMOS logic circuits.

According to some embodiments of the invention, a line loading of a data output path can be substantially reduced in a semiconductor memory device such as an SRAM etc. In addition, a logical ORing operation for data lines can be performed at a relatively high speed.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS OF THE INVENTION

Embodiments of the present invention now will be described more fully hereinafter with reference to FIGS. 4 to 8, in which embodiments of the invention are shown. This invention may, however, be embodied in many different forms and should not be construed as limited to the embodiments set forth herein. Rather these embodiments are provided so that this description will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
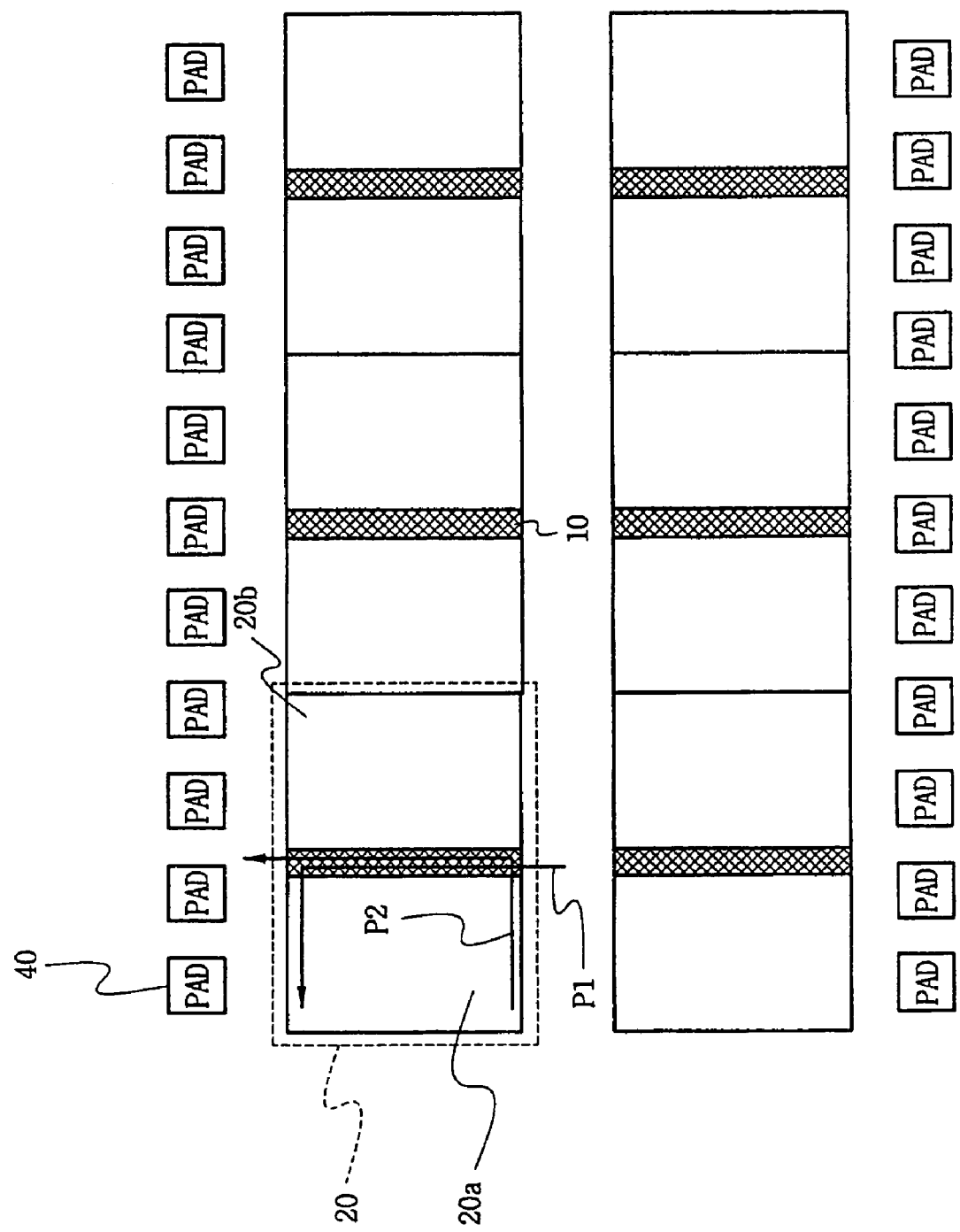
FIG. 1 contains a layout diagram which illustrates a layout of memory mats in an SRAM according to conventional art.
Figure 2:
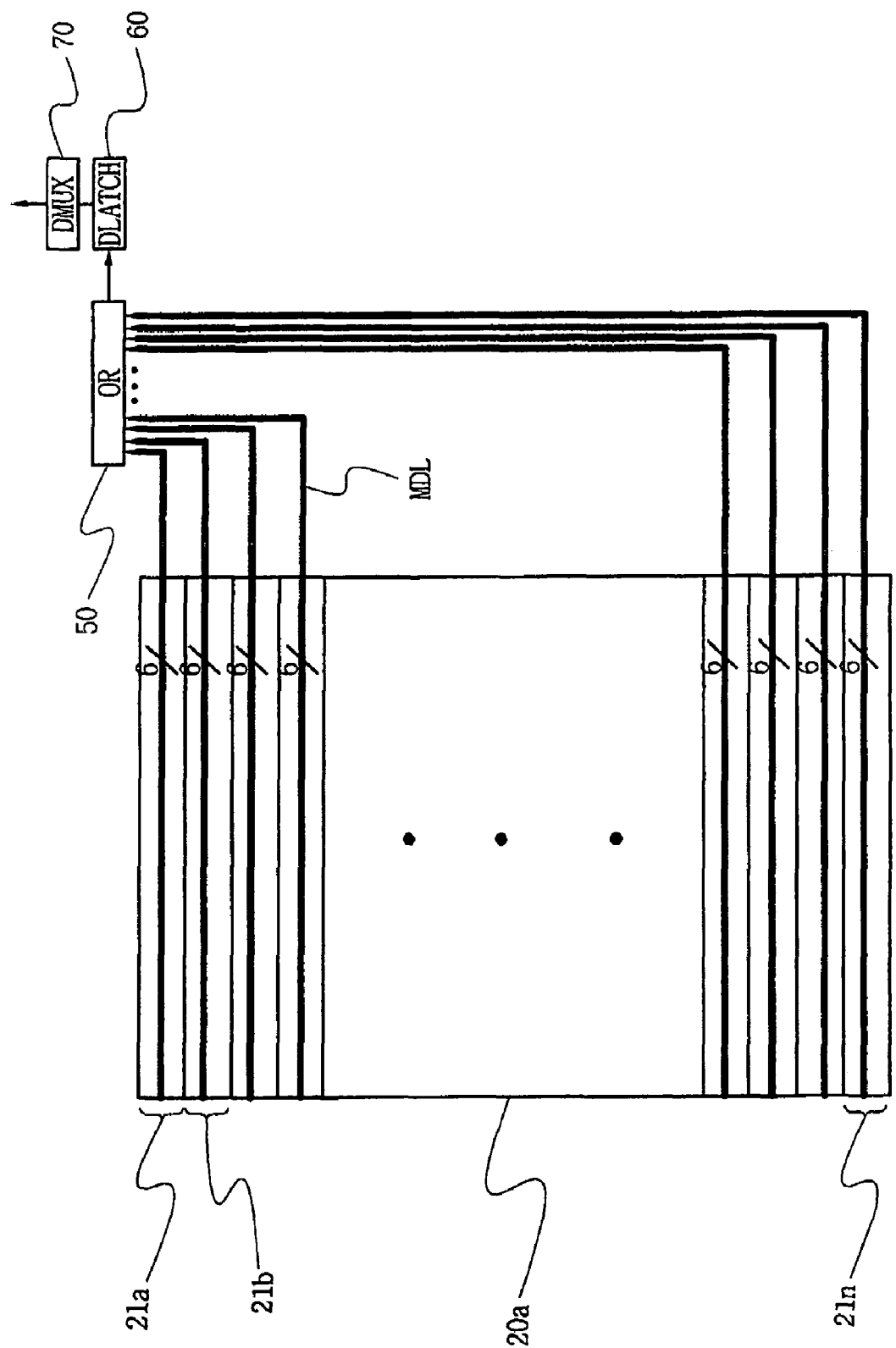
FIG. 2 contains a schematic diagram which illustrates a data path of sub mats constituting a memory mat of FIG. 1.
Figure 3:
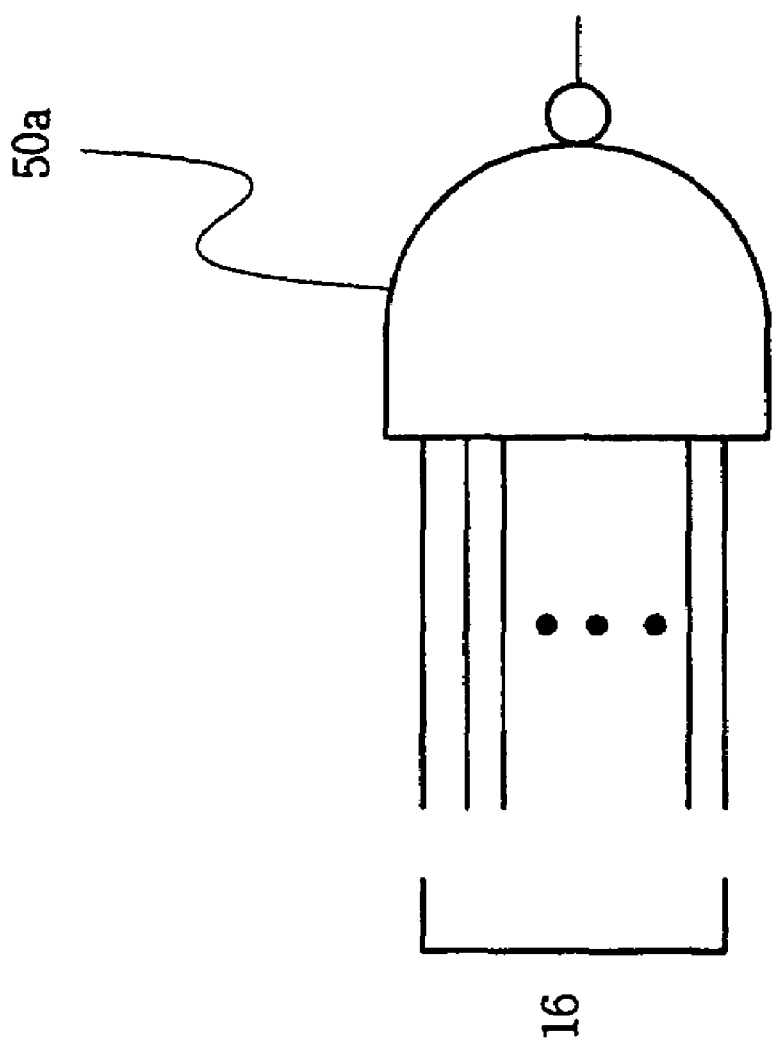
FIG. 3 contains a schematic logic diagram which illustrates a logic gate of an ORing unit shown in FIG. 2.
Figure 4:
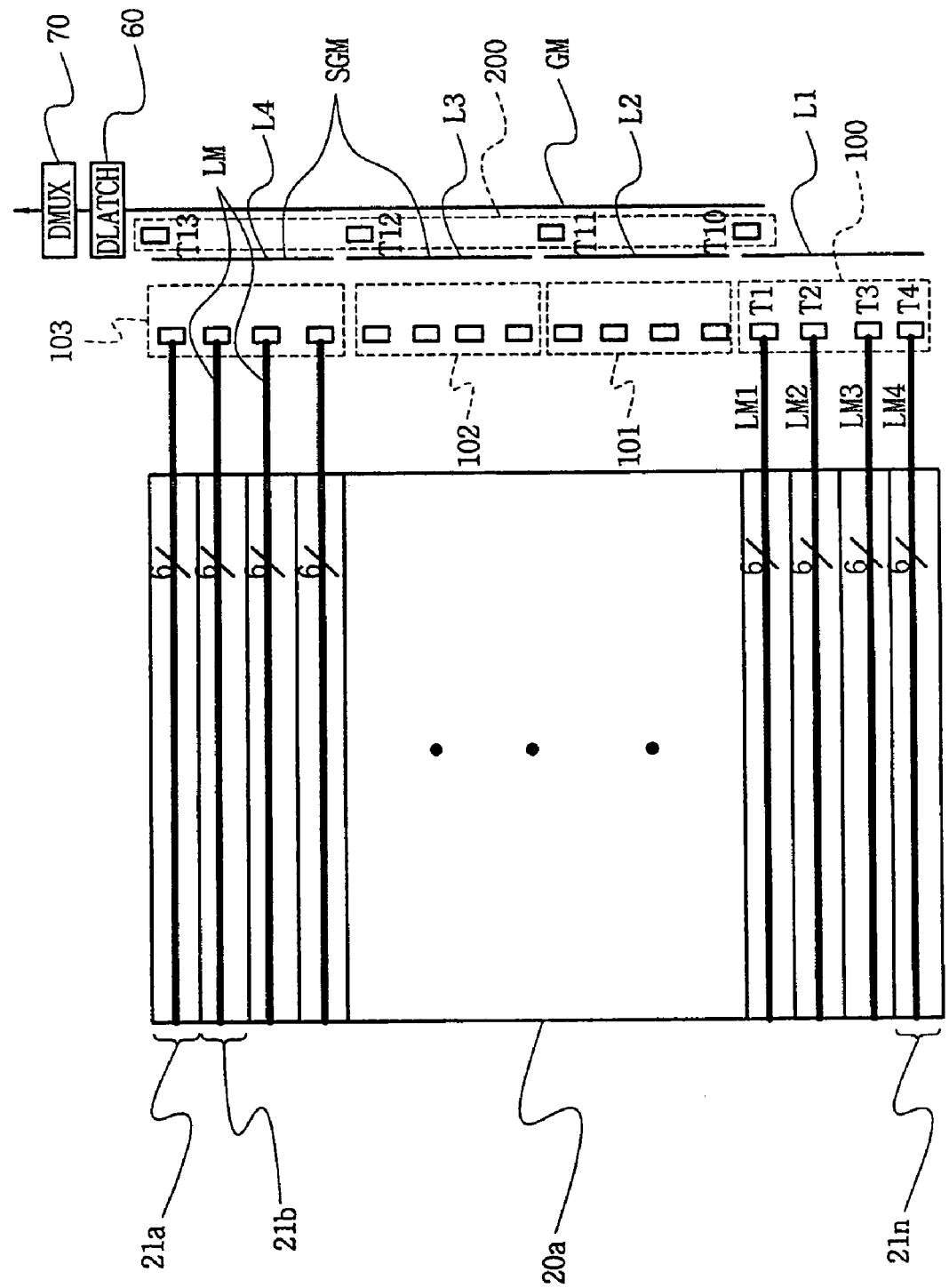
FIG. 4 contains a schematic diagram which illustrates a data path of sub mats according to some embodiments of the invention, as being compared with FIG. 2.
Figure 5:
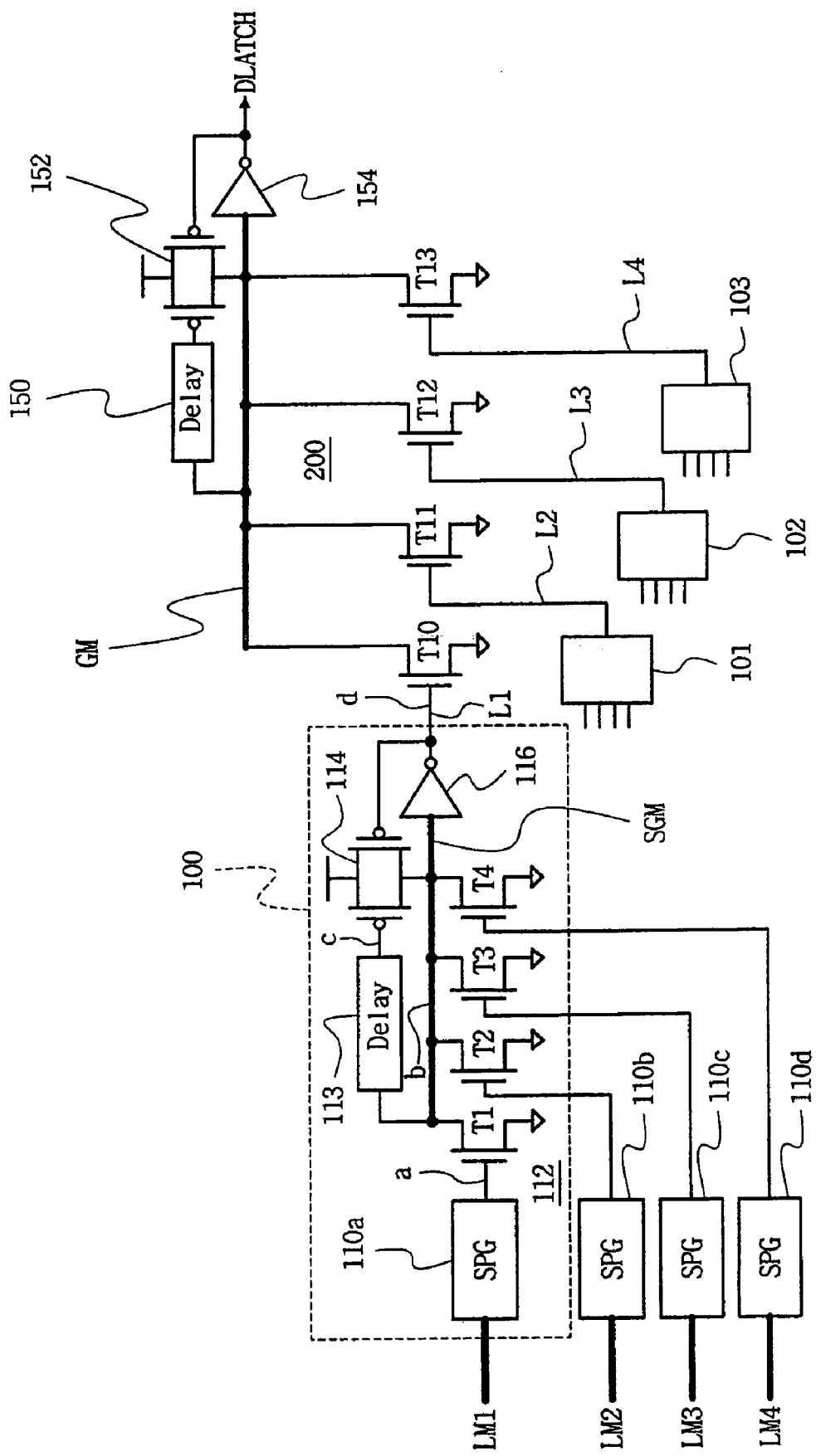
FIG. 5 is a circuit diagram illustrating a connection between data lines and line driver shown in FIG. 4.
Figure 6:
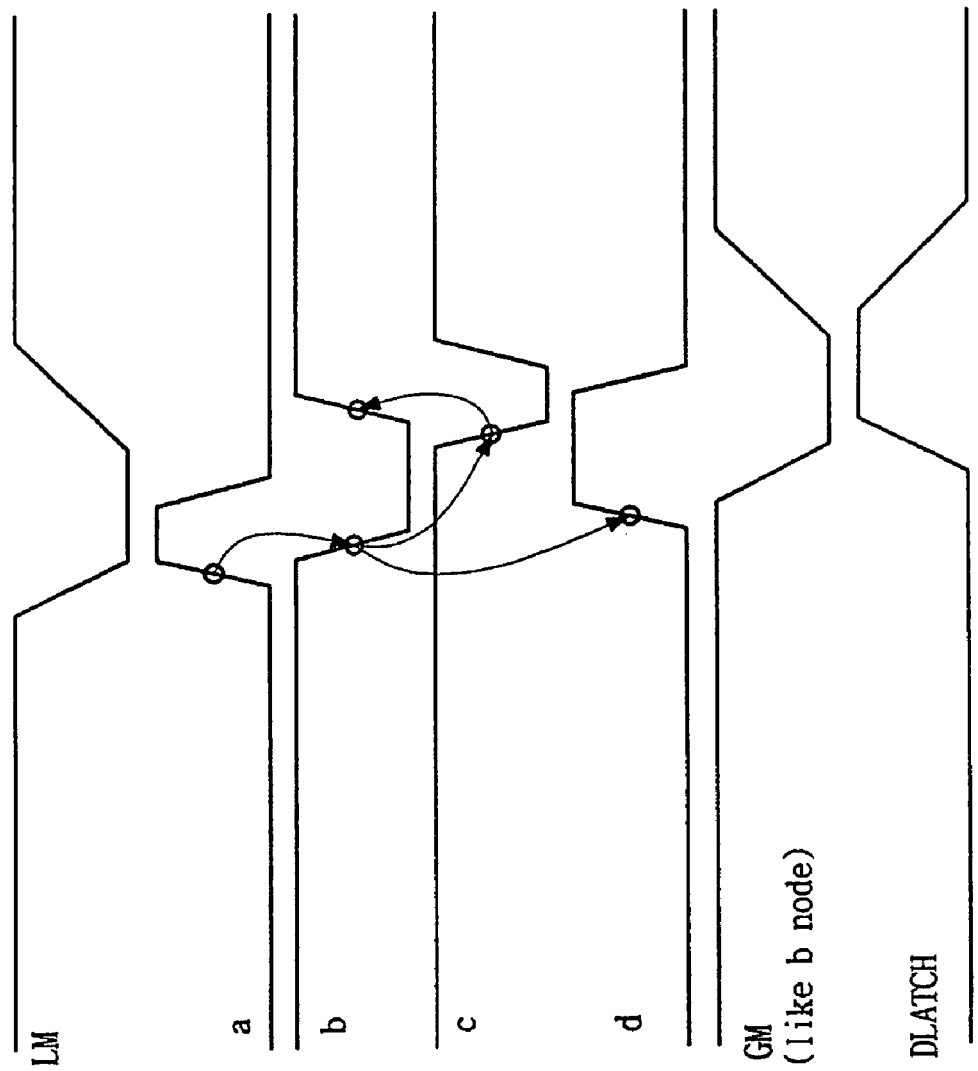
FIG. 6 contains a timing diagram illustrating timing of operation of the line driver shown in FIG. 5.
Figure 7:
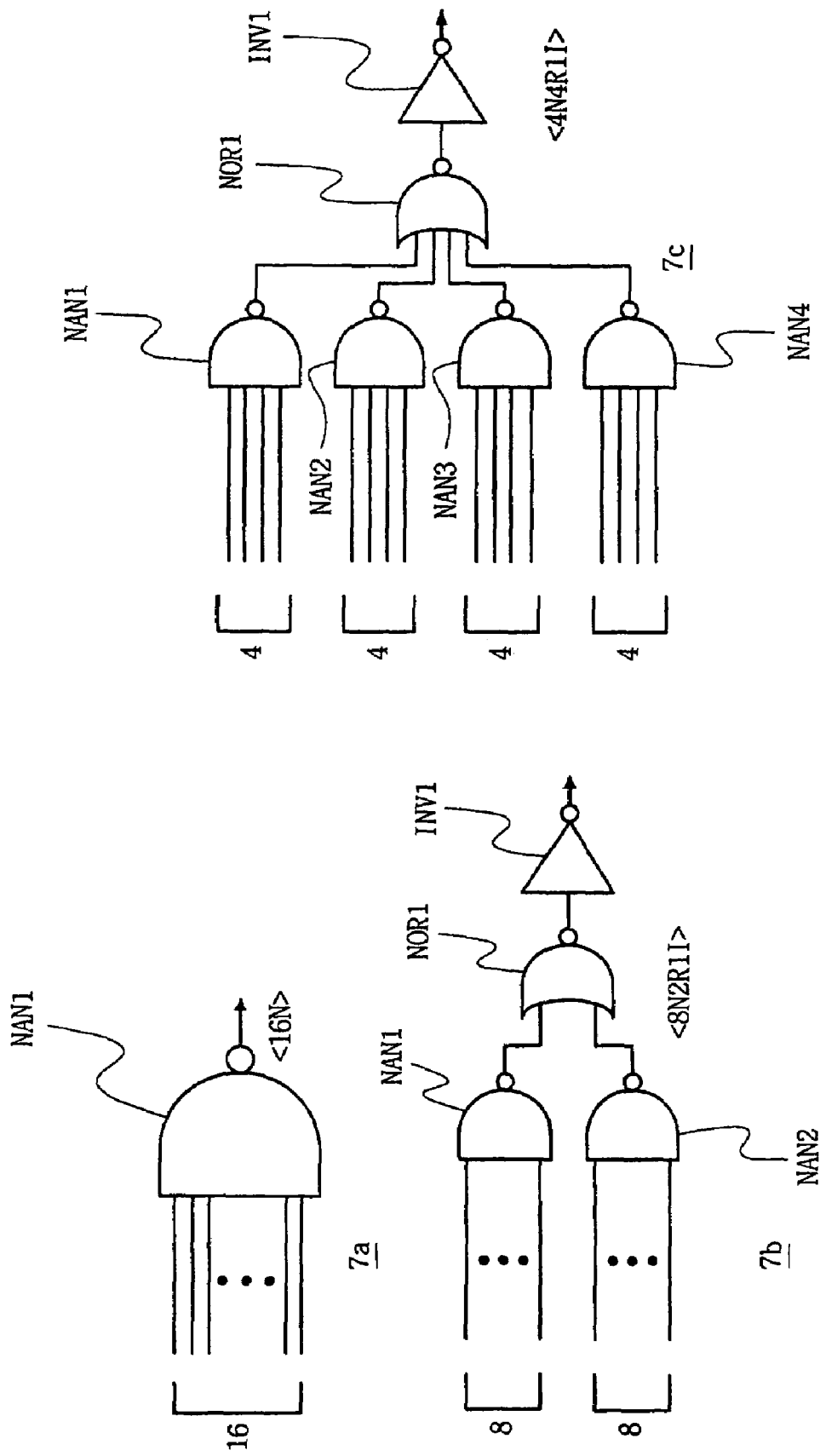
FIG. 7 contains schematic logic diagrams illustrating various examples of a general ORing unit applicable to the line driver of FIG. 5.
Figure 8:
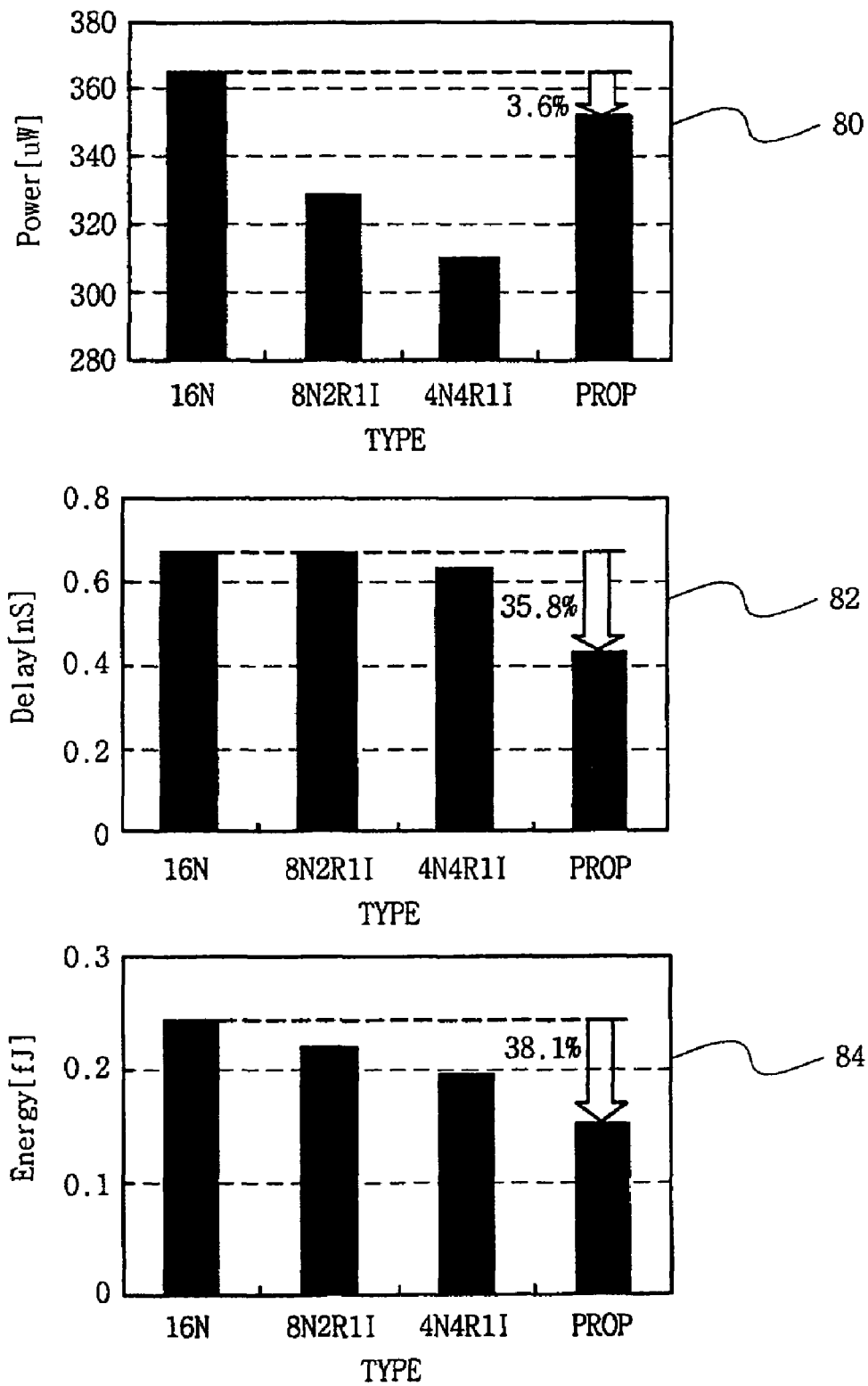
FIG. 8 illustrates several graphs comparing effects based on FIG. 4 with conventional art.

FIG. 4 illustrates a data path of sub mats according to some embodiments of the invention, with a comparison with the data path of the conventional art shown in FIG. 2. FIG. 5 is a circuit diagram illustrating a connection between data lines and the line driver shown in FIG. 4. FIG. 6 illustrates operation timing of the line driver shown in FIG. 5. FIG. 7 shows various examples of a general ORing unit applicable to the line driver of FIG. 5. FIG. 8 illustrates several graphs comparing effects based on FIG. 4 with the conventional art.

Referring to FIG. 4 showing a half memory mat 20a, the half memory mat 20a is subdivided into a plurality of sub mats 21a, 21b, . . . , and 21n. There are three kinds of data lines in FIG. 4, and for an explanatory convenience, a first data line is called a local main data line LM, a second data line a sub global main data line SGM, and a third data line a global main data line GM.

Per sub mat 21n within a memory mat, a plural number of local main data lines LM (six in FIG. 4) are connected thereto. The sub global main data lines SGM are higher in a hierarchy with regard to the local main data lines LM, and are smaller in number compared with the number of local main data lines LM. The global main data line GM is disposed higher in the hierarchy with respect to the second data lines SGM, and transfers data provided through the second data lines SGM, to a data latch 60.

Four first-data line drivers 100-103 are connected between the first data lines LM and the second data lines SGM, and perform a logical ORing operation for output of the first data lines LM so as to drive, a corresponding second data line. A second data line driver 200 is connected between the second data lines SGM and the third data line GM, and performs a logical ORing operation for output of the second data lines SGM so as to drive the third data line GM.

The hierarchical line layout shown in FIG. 4 can reduce the number of data lines disposed on a center portion of a memory mat, thus data lines can be disposed effectively, and a relatively fast OR logical operation for data lines can be performed. The high speed hierarchical data path of high density SRAM shown in FIG. 4 will be further described in detail with reference to FIG. 5.

Referring to FIG. 5 illustrating a connected relation of data lines and line driver shown in FIG. 4, there are shown a first data line driver 100 corresponding to a reference number 100 of FIG. 4, and a second data line driver 200 corresponding to a reference number 200 of FIG. 4. A precharge node (b) of the first data line driver 100 becomes a second data line of FIG. 4, a sub global main data line SGM.

The first data line driver 100 includes a plurality of short pulse generators 110a-110d connected to respective first data lines LM, for generating a short pulse having a determined width when a logic of read data has a first state, i.e., low level; a plurality of NMOS transistors T1-T4 whose respective gate terminals are connected to an output terminal of the short pulse generator 110a-110d, whose respective drain terminals are connected in common to the second data line SGM, and whose respective source terminals are connected to a ground voltage; and a precharge unit for precharging the second data line SGM to a determined power source voltage VDD. The precharge unit may be realized by a PMOS transistor 114, a delay device 113 and an inverter 116 which are coupled to the second data line SGM.

The second data line driver 200 includes a plurality of NMOS transistors T10-T13 whose respective gate terminals are connected to each output of the first data line driver 100, whose respective drain terminals are connected in common to the third data line GM, and whose respective source terminals are connected to a ground voltage; and a precharge unit for precharging the third data line GM to a determined power source voltage. The precharge unit may be realized by a PMOS transistor 152, a delay device 150, and an inverter 154.

As described above, in some embodiments of the invention, a hierarchical structure is provided by changing the structure of a conventional main data line MDL in order to reduce the number of data lines in a memory mat. A data line loading in a sub mat can be substantially reduced by positioning a portion of inputs of the OR logic in an output side of local main data line LM of each sub mat. Loading of the global main data line GM can be also reduced through the hierarchical line layout structure of the invention. For example, as shown in FIGS. 4 and 5, in disposing a sub global main data line SGM per sub mat based on a unit of four, a loading of overall global main data lines GM is substantially reduced, and a loading of main data lines per section is also substantially reduced by the hierarchical structure. This structure can also substantially reduce the number of main data lines in the memory mat.

Referring back to FIG. 5, each of the first and second data line drivers 100 and 200 may be realized as a circuit of dynamic CMOS logic type in order to substantially reduce a delay time from a logical ORing operation of conventional OR logic. Operation of a dynamic OR logic for data path in FIG. 5 is as follows.

Describing operation in a transmission mode of data, data stored in an accessed SRAM memory cell is sensed by a sense amplifier of a sub mat, and an output of the sense amplifier is transferred to first data line, a local main data line LM. When the transferred data of memory cell has a logic '0', local main data line LM that has been precharged to a level of the power source voltage is discharged to a low level. Then, when input through one local main data line LM from among 16 inputs becomes low, the short pulse generators 110a-110d in the first data line driver 100 of FIG. 5 generate a short pulse (SP). For example, a short pulse generated from an output terminal (a) of the short pulse generator 110a has a waveform as shown in waveform (a) of FIG. 6. When a short pulse is generated from the short pulse generator, a voltage level of sub global main data line SGM precharged is discharged to a ground level. In this case, node (b) of the sub global main data line SGM has a waveform as shown in waveform (b) of FIG. 6. A level of node (d) becomes a high level as shown in waveform (d) of FIG. 6 by an inverting operation of the inverter 116, and after a lapse of given time, a gate node (c) of a precharge transistor 114 becomes a low level and so a turn-on operation of the precharge transistor 114 restarts. When the node (d) becomes a high level as illustrated in waveform (d), an NMOS transistor T10 of second data line driver 200 is turned on. Then, precharged global main data line GM is discharged to a low level, and an output of the inverter 154 becomes a high level. An output of the inverter 154 is applied to the data latch 60 disposed in a back stage, and is stored as data. As illustrated in the waveforms of FIG. 6, the circuit of FIG. 5 performs an operation of edge-triggered dynamic logic, thus providing a relatively fast data transmission. Consequently, a logical ORing operation of NAND gating type as in FIG. 5 is remarkably fast as compared with a gating operation of conventional NOR gate, thus obtaining data transmission at a high speed.

In the circuit of FIG. 5, a reset operation of first data line driver 100 is performed when a low signal appearing in node (b) is delayed and then is output to node (c). Consequently, when a logic level of node (c) is provided as shown in waveform (c) of FIG. 6, a precharge operation of the precharge unit restarts. The circuit can be designed herein so as not to overlap between a pulse width generation section of waveform (a) and a pulse width generation section of waveform (c), thereby eliminating a short circuit current. A determination of the delay time decides a pulse width of waveform (d).

Similarly, operation of the second data line driver 200 is actually identical with operation of the first data line driver 100. Consequently, a global main data line GM is precharged after a lapse of given time and then returns to a standby state.

FIG. 7 provides logic circuit diagrams of various configurations of a general ORing unit also applicable to the line driver of FIG. 5. In some embodiments of the invention, the logical ORing operation was illustrated above with the structure in each of the first and second data line drivers 100 and 200 of FIG. 5, unlike the ORing unit shown in FIG. 7. However, the ORing unit of FIG. 7 may be applied to the circuit. Diagram 7a of FIG. 7 shows a configuration of a 16-input NAND gate, 7b shows 8-input NAND gates, and 7c shows 4-input NAND gates.

FIG. 8 illustrates several graphs comparing the effect of the circuit of FIG. 4 with a conventional circuit. Reference graphs 80, 82 and 84 indicate power, delay and energy. In the graph 80 based on a simulated experiment result, power consumed graph PROP of the invention is greater than 8N2R1I and 4N4R1I in power consumption, but is smaller by about 3.6% than 16N of a simplest conventional structure. As a result, power consumption is not so great even with the increase in the number of gates. According to another important comparison, graph 82 indicates delay time in data transmission, in which it can be clarified in the graph PROP of the invention that the delay time is shortest as compared with the other three types. In the graph 84 indicating energy, the graph PROP of the invention has much better characteristics than that of a conventional and general OR logic.

As described above, according to some embodiments of the invention, a hierarchical layout structure of data lines can reduce the number of data lines disposed in a center portion of a memory mat, realizing a compact layout structure, and can reduce the number of lines and loading of lines along with a reduction in current consumption, and can also enhance performance of devices by lessening skew between output data with a high speed read operation.

According to some embodiments of the invention as described above, line loading of data output path can be substantially reduced in a semiconductor memory device such as SRAM etc, In addition, a logical ORing operation for data lines can be performed at a relatively higher speed, and the number of data lines in a memory mat can be substantially reduced, lessening data skew and improving a device characteristic.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, the number of sub mats or data lines and layout details of line drivers may be changed. Accordingly, these and other changes and modifications are seen to be within the true spirit and scope of the invention as defined by the appended claims.

What is claimed is:

1. A data line layout structure in a semiconductor memory device, comprising:
    a plurality of first data lines connected to sub mats in a memory mat, a predetermined number of first data lines being connected to each sub mat;
    second data lines being fewer in number than the first data lines and being disposed so as to form a hierarchy with respect to the first data lines;
    a third data line disposed to be higher in the hierarchy with respect to the second data lines, the third data line transferring data provided through the second data lines to a data latch;
    a first data line driver connected between the first data lines and the second data lines, the first data line driver performing a logical ORing operation on output of the first data lines so as to drive a corresponding second data line; and
    a second data line driver connected between the second data lines and the third data line, the second data line driver performing a logical ORing operation on output of the second data lines so as to drive the third data line.

2. The structure of claim 1, wherein the first and second data line drivers each receive at least four lower inputs.

3. The structure of claim 2, wherein the first and second data line drivers each have a driving operation of dynamic CMOS logic type.

4. The structure of claim 1, wherein the first and second data line drivers each include an 8-input NAND gate.

5. The structure of claim 1, wherein the first and second data line drivers each include a 4-input NAND gate.

6. The structure of claim 1, wherein when the number of sub mats in the memory mat is 16, the number of memory mats is 6.

7. The structure of claim 6, wherein the memory mats constitute a memory cell array of a static random access memory (RAM).

8. The structure of claim 7, wherein a decoding and a data path of the static RAM have a structure to reduce a signal skew.

9. The structure of claim 2, wherein the first data line driver comprises:
    a plurality of short pulse generators connected to the first data line, for generating a short pulse having a determined width when a logic of read data has a first state;
    a plurality of NMOS transistors whose respective gate terminals are coupled to each output terminal of the short pulse generators, whose respective drain terminals are coupled in common to the second data line, and whose respective source terminals are
    a precharge unit for precharging the second data line to a determined power source voltage.

10. The structure of claim 9, wherein the second data line driver comprises:
    a plurality of NMOS transistors whose gate terminals are individually connected to each output of the first data line driver, whose drain terminals are individually connected in common to the third data line, and whose source terminals are individually connected to a ground voltage; and
    a precharge unit for precharging the third data line to a determined power source voltage.

11. The structure of claim 10, wherein the precharge unit comprises a PMOS transistor, a delay device and an inverter which are connected to the third data line.

* * * * *